United States Patent

Sun et al.

(10) Patent No.: US 8,206,829 B2
(45) Date of Patent: Jun. 26, 2012

(54) PLASMA RESISTANT COATINGS FOR PLASMA CHAMBER COMPONENTS

(75) Inventors: Jennifer Y. Sun, Sunnyvale, CA (US); Xiao-Ming He, Arcadia, CA (US); Senh Thach, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 541 days.

(21) Appl. No.: 12/268,196

(22) Filed: Nov. 10, 2008

(65) Prior Publication Data

US 2010/0119843 A1   May 13, 2010

(51) Int. Cl.
*B32B 15/04* (2006.01)
*B32B 17/06* (2006.01)
*C23C 14/28* (2006.01)
*H05H 1/24* (2006.01)

(52) U.S. Cl. ........ 428/426; 428/457; 428/701; 427/532; 427/523; 427/569; 427/595

(58) Field of Classification Search ............................ None
See application file for complete search history.

(56) References Cited

U.S. PATENT DOCUMENTS

| | | | |
|---|---|---|---|
| 5,294,489 A * | 3/1994 | Luthra et al. ................ | 428/379 |
| 5,540,959 A | 7/1996 | Wang | |
| 5,939,197 A | 8/1999 | Blohowiak et al. | |
| 6,025,078 A * | 2/2000 | Rickerby et al. ............ | 428/469 |
| 6,110,604 A * | 8/2000 | Rickerby ..................... | 428/623 |
| 6,183,884 B1 * | 2/2001 | Rickerby ..................... | 428/623 |
| 6,207,304 B1 | 3/2001 | Law et al. | |
| 6,221,512 B1 * | 4/2001 | Rickerby ..................... | 428/623 |
| 6,368,899 B1 * | 4/2002 | Featherby et al. ........... | 438/127 |
| 6,614,178 B1 * | 9/2003 | Okada ........................... | 313/509 |
| 6,776,873 B1 | 8/2004 | Sun et al. | |
| 6,780,787 B2 | 8/2004 | O'Donnell et al. | |
| 6,789,498 B2 | 9/2004 | Kaushal et al. | |
| 6,933,254 B2 | 8/2005 | Morita et al. | |
| 6,942,929 B2 | 9/2005 | Han et al. | |
| 7,119,032 B2 | 10/2006 | Ji et al. | |
| 7,220,497 B2 | 5/2007 | Chang | |
| 7,300,537 B2 | 11/2007 | O'Donnell et al. | |
| 7,311,797 B2 | 12/2007 | O'Donnell et al. | |
| 7,544,398 B1 * | 6/2009 | Chang et al. .................. | 427/537 |
| 2002/0170176 A1 * | 11/2002 | Rigney et al. ................ | 29/889.1 |

(Continued)

FOREIGN PATENT DOCUMENTS

JP   2002306957   10/2002

OTHER PUBLICATIONS

International Search Report and Written Opinion for PCT Application No. PCT/US2009/063437, mailed May 24, 2010, 11 pgs.

(Continued)

*Primary Examiner* — Jennifer McNeil
*Assistant Examiner* — Vera Katz
(74) *Attorney, Agent, or Firm* — Blakely, Sokoloff, Taylor & Zafman (57) ABSTRACT

Plasma resistant coating materials, plasma resistant coatings and methods of forming such coatings on hardware components. In one embodiment, hardware component is an electrostatic chuck (ESC) and the plasma resistant coating is formed on a surface of the ESC. The plasma resistant coatings are formed by methods other than thermal spraying to provide plasma resistant coatings having advantageous material properties.

24 Claims, 11 Drawing Sheets

U.S. PATENT DOCUMENTS

| | | | |
|---|---|---|---|
| 2004/0121146 A1* | 6/2004 | He et al. | 428/332 |
| 2005/0024809 A1* | 2/2005 | Kuchimachi | 361/234 |
| 2005/0037193 A1 | 2/2005 | Sun et al. | |
| 2005/0042885 A1 | 2/2005 | Li et al. | |
| 2005/0109606 A1* | 5/2005 | He et al. | 204/192.14 |
| 2005/0112289 A1 | 5/2005 | Trickett et al. | |
| 2005/0227118 A1* | 10/2005 | Uchimaru et al. | 428/702 |
| 2006/0051561 A1* | 3/2006 | Badyal | 428/195.1 |
| 2007/0026246 A1* | 2/2007 | Harada et al. | 428/469 |
| 2009/0214825 A1* | 8/2009 | Sun et al. | 428/141 |

OTHER PUBLICATIONS

International Preliminary Report on Patentability for PCT Application No. PCT/US2009/063437, mailed May 10, 2011, 5 pages.

* cited by examiner

PLASMA RESISTANT COATINGS FOR PLASMA CHAMBER COMPONENTS

BACKGROUND

1) Field

Embodiments of the present invention pertain to the field of plasma processing equipment and, in particular, to plasma resistant coatings for components of a plasma processing chamber.

2) Description of Related Art

Vacuum plasma processing chambers are used for plasma processing during fabrication of devices, such as photovoltaics and integrated circuits. Process gases are flowed into the processing chamber while a field is applied to the process gases to generate a plasma of the process gases. To reduce operating costs, the lifetimes of the components within a plasma processing chamber exposed to the processing plasma are extended by designing the components to be plasma resistant. As used herein, the term "plasma resistant" refers to a resistance to erosion and corrosion when exposed to the plasma processing conditions generated within the plasma processing chamber. Plasma resistant components are currently formed out of bulk materials or by thermal spraying a protective coating over a substrate.

Figure 1:
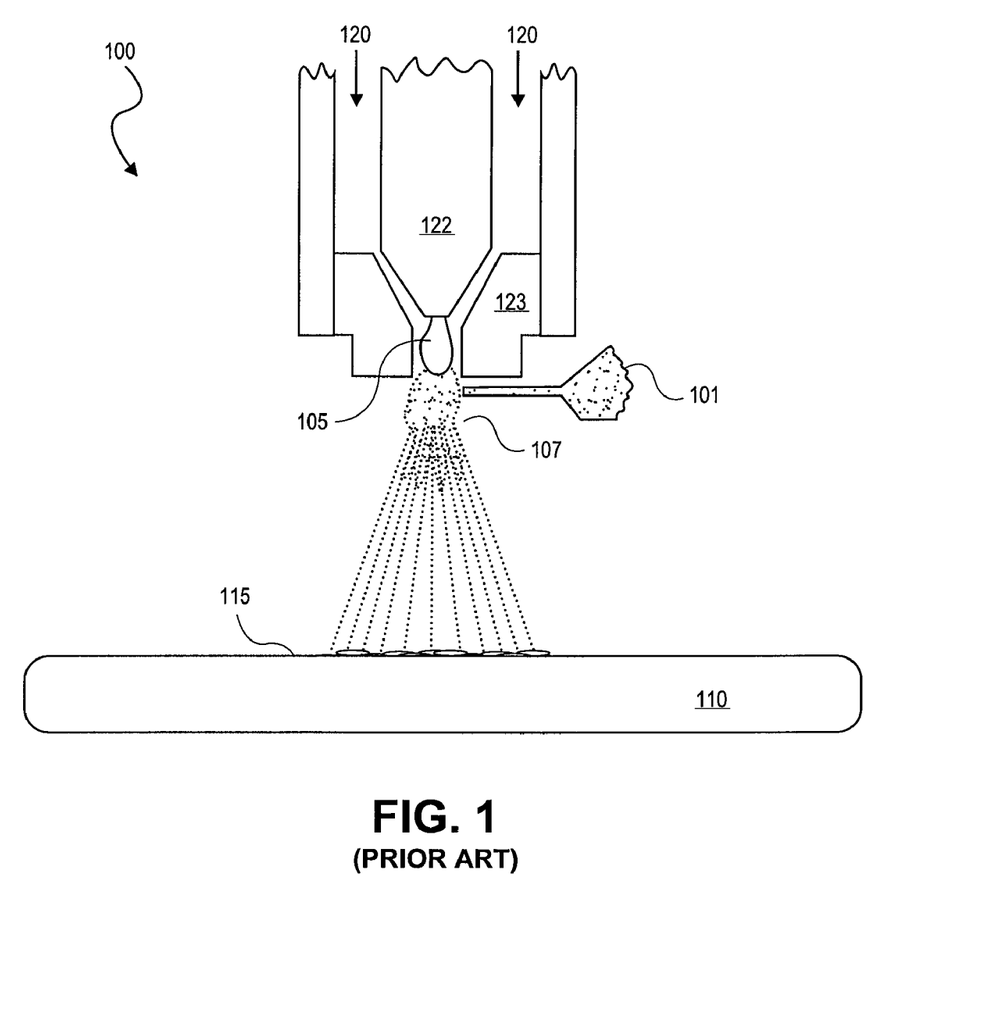
FIG. 1 illustrates a conventional means of applying a coating to a component.

FIG. 1 depicts a conventional thermal spraying method 100 employing a plasma, commonly referred to as plasma spraying. The feedstock material 101, usually in the form of a powder, liquid or wire, is introduced into a high temperature plasma torch 105. A feed gas 120 (e.g., argon, nitrogen, hydrogen, helium) flows around a cathode 122 toward an anodic nozzle 123. A plasma is initiated by a high voltage discharge, which causes localized ionization and a conductive path for an electrical arc to form between the cathode 122 and the anodic nozzle 123, thereby forming a plasma discharge of the feed gas 120. The plasma exits the anodic nozzle 123 as a plasma torch 105 which does not carry electric current (i.e., a neutral plasma). The temperature of the plasma torch is on the order of 10,000K, melting or softening the feedstock material 101 into droplets 107 and propelling them towards the substrate 110.

The molten droplets 107 flatten upon impinging the substrate 110 and rapidly solidify to form a coating 115 consisting of pancake-like lamellae commonly referred to as "splats." As the feedstock particles usually have sizes from a few micrometers (μm) to more than 100 μm, one lamella typically has a thickness of about 1 μm and lateral dimension from several to more than 100 μm. Between individual lamella, there are small voids, such as pores, cracks and regions of incomplete bonding.

SUMMARY

Embodiments of the present invention include plasma resistant coating materials, plasma resistant coatings and methods of forming such coatings on hardware components. In particular embodiments, the hardware components are plasma chamber components which are exposed to plasmas during processing performed by the plasma chamber. In one such embodiment, the plasma chamber component is an electrostatic chuck (ESC) and the plasma resistant coating is formed on a surface of the ESC, for example on a puck surface upon which a workpiece is disposed within a plasma chamber during plasma processing.

In an embodiment, a plasma resistant coating comprises a ceramic non-native to the substrate upon which the coating is deposited and the plasma resistant coating is formed in a manner to have a porosity below 1%. It has been found that this low porosity significantly increases the coating's plasma erosion resistance and reduces particulate contamination within the plasma chamber over the lifetime of the component. In another embodiment, a plasma resistant coating surface has an arithmetic average roughness ($R_a$) of less than 1 μm. Contrary to convention, it has been found that coatings with this low surface roughness, particularly when applied to an ESC, significantly reduce particulate contamination. In another particular embodiment, a plasma resistant coating is formed in a manner to have a breakdown voltage of at least 1000 V/mil, which is considerably higher than conventional coatings.

In an embodiment, a plasma resistant coating is formed in a manner to include at least one of an oxide, nitride, boride, carbide, or halide of yttrium (Y), iridium (Ir), rhodium (Rh) or lanthanoid, such as Erbium (Er). In some embodiments, the plasma resistant coating is formed in a manner to be amorphous or polycrystalline with a fine grain structure. Particular polycrystalline embodiments have a crystal texture with a non-random, "preferred" out-of-plane growth orientation. In one such embodiment, the preferred out-of-plane growth orients a crystal plane of highest density on the coating surface to face the plasma. It has been found that atom stacking along preferential crystal orientations improves the plasma resistance of the coating. Certain embodiments further include an intermediate layer or layers disposed between the substrate and the plasma resistant coating. The intermediate layer(s) may include an oxide of an element absent in the plasma resistant coating, or a combination of an oxide or nitride or carbide of an element absent in the plasma resistant coating, such as silicon dioxide and silicon carbide to provide a hybridized coating tailored for specific performance characteristics, such as leakage currents.

Embodiments further include methods of forming a plasma resistant coating on a plasma chamber component under conditions which expose the plasma resistant coating to energetic particles as the coating is formed or subsequent to the coating formation. The energetic particles include ions, neutron atoms, radicals, and nano-sized particles which come from particle generation sources, such as the plasma, reactive gases or from the material source that provide the deposition materials. Exemplary processes providing such conditions include ion assisted deposition (IAD), ionized metal plasma (IMP) activated reactive evaporation (ARE) or plasma immersion ion process (PIIP). Particular deposition method embodiments include at least one of a halogen or oxygen as a reactive gas species and may further include electrically biasing the substrate while the plasma resistant coating is deposited over the component substrate. Other embodiments include forming a plasma resistant coating over the component with a nanoparticle mass flow deposition processes or with a sol-gel deposition process to achieve the coating compositions, structural and electrical characteristics described herein.

BRIEF DESCRIPTION OF THE DRAWINGS

Embodiments of the present invention are illustrated by way of example, and not limitation, in the figures of the accompanying drawings in which.

DETAILED DESCRIPTION

Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. In the following description, numerous specific details are set forth, such as fabrication conditions and materials, to provide a thorough understanding of the present invention. However, particular embodiments may be practiced without one or more of these specific details, or in combination with other known methods, materials and apparatuses. Furthermore, the particular features, structures, materials, or characteristics described may be combined in any suitable manner in one or more embodiments. It should also be understood that specific embodiments may be combined where not mutually exclusive. The accompanying Figures are illustrative representations and not necessarily drawn to scale.

The terms "over," "under," "between," and "on" as used herein refer to a relative position of one member with respect to other members. As such, for example, one member disposed over or under another member may be directly in contact with the other member or may have one or more intervening members. Moreover, one member disposed between members may be directly in contact with the two members or may have one or more intervening members. In contrast, a first member "on" a second member is in contact with that second member. Additionally, the relative position of one member with respect to other members is provided assuming operations are performed relative to a substrate without consideration of the absolute orientation of the substrate.

Figure 2:
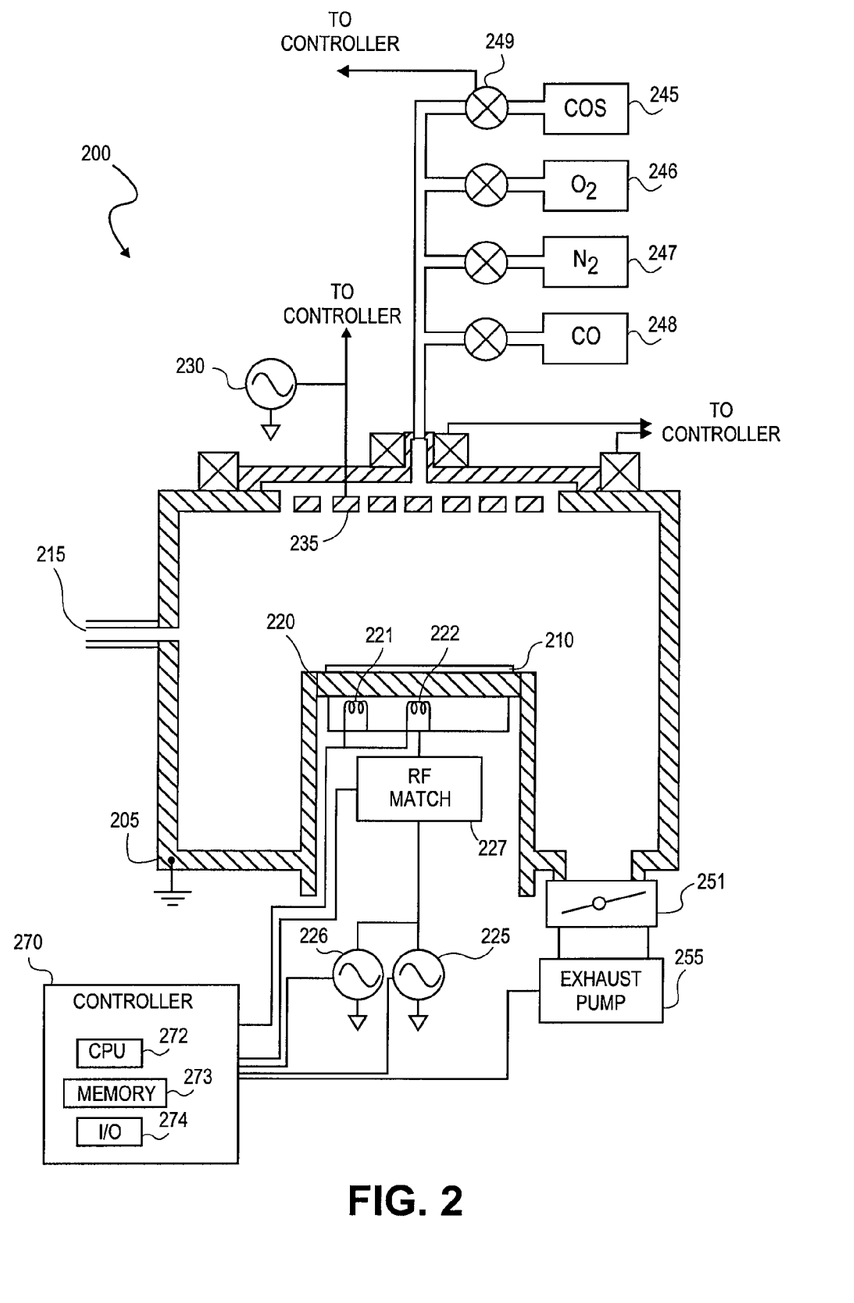
FIG. 2 illustrates a plasma processing chamber in which a component having plasma resistant coating in accordance with an embodiment of the present invention may be utilized.

Embodiments of the present invention include plasma resistant coating materials, plasma resistant coatings and methods of forming such coatings on hardware components. In particular embodiments, the hardware components are plasma chamber components which are exposed to plasmas during plasma processing performed by the plasma chamber. As an example of a plasma processing chamber, a cross-sectional view of a plasma etch system 200 is shown in FIG. 2. The plasma etch system 200 includes a process chamber 205. A workpiece 210 is loaded through an opening 215 and clamped to a cathode 220. In particular embodiments, the cathode 220 holds the workpiece 210 with an electrostatic force (e.g., an electrostatic chuck or ESC). In further embodiments, the cathode 220 includes a plurality of zones, each zone independently controllable to a temperature setpoint, such as with a first thermal zone 222 proximate a center of the workpiece 210 and a second thermal zone 221 proximate to a periphery of the workpiece 210. Process gases, are supplied from gas sources 245, 246, 247 and 248 through respective mass flow controllers 249 to the interior of the process chamber 205. The process chamber 205 is evacuated, for example to between 5 mTorr and 500 mTorr via a high capacity vacuum pump stack 255 connected through an exhaust valve 251.

When RF power is applied, a plasma is formed in a chamber processing region over the workpiece 210. A bias power RF generator 225 is coupled to the cathode 220 to provide bias power and further energize the plasma. In certain embodiments, the plasma etch system 200 includes a third bias power RF generator 226 at a distinct frequency band which is connected to a RF match 227 along with the bias power RF generator 225. A source power RF generator 230 is coupled through a match (not depicted) to a plasma generating element 235 which may be anodic relative to the cathode 220 to provide high frequency source power to energize the plasma. The source RF generator 230 typically has a higher frequency than the bias power RF generator 225, for example between 100 and 180 MHz. Bias power affects the bias voltage on the workpiece 210, controlling ion bombardment of the workpiece 210, while source power affects the plasma density relatively independently of the bias on the workpiece 210.

The plasma etch system 200 is computer controlled by a controller 270 to control the low frequency bias power, high frequency source power, etchant gas flows, process pressure and cathode temperatures, as well as other process parameters. Generally, a controller 270 includes a central processing unit (CPU) 272 in communication with a memory 273 and input/output (I/O) circuitry 274, among other common components. Software commands, executed by the CPU 272, cause the plasma etch system 200 to, for example, load the workpiece 210 into a plasma etch chamber, introduce an etchant gas mixture into the process chamber 205 and etch the workpiece 210.

Figure 3A:
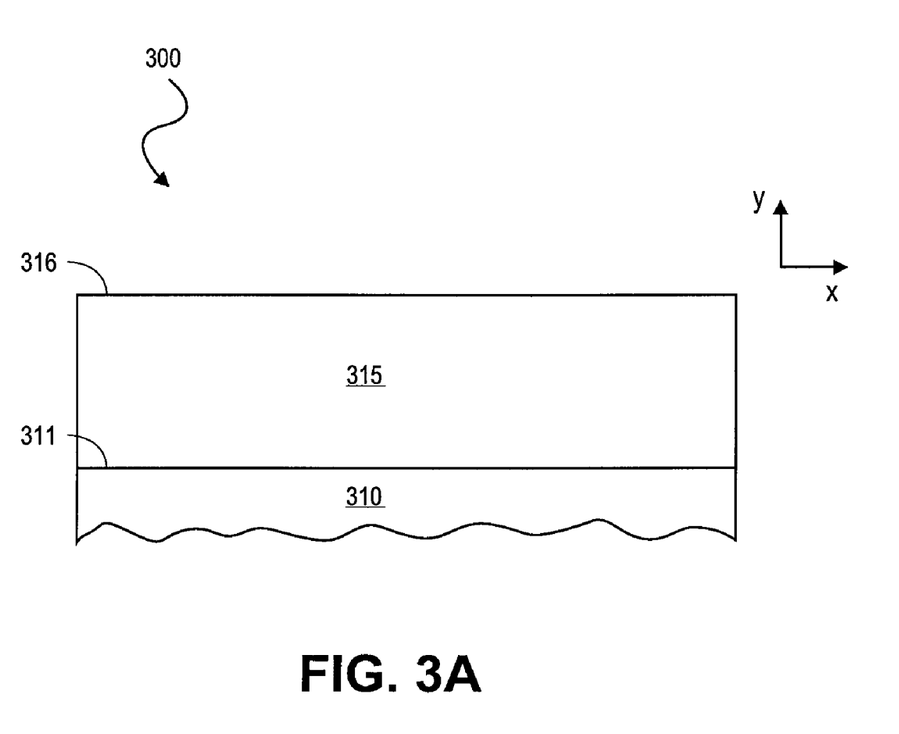
FIG. 3A illustrates a cross-sectional view of a plasma resistant coating formed on a surface of a component in accordance with an embodiment of the present invention.
Figure 4A:
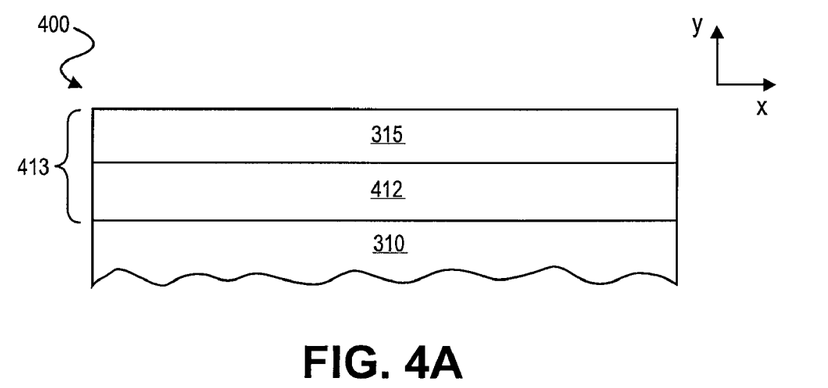
FIG. 4A illustrates a cross-sectional view of a hybrid plasma resistant coating formed on a surface of a component in accordance with an embodiment of the present invention.

At least one component of a plasma processing system, such as plasma etch system 200, includes a plasma resistant coating, as schematically depicted in FIG. 3A or 4A. Any of the components making up the process chamber 205 may be coated with such a plasma resistant. Exemplary chamber components include process kits, focus rings, shower heads and lids. In a particular embodiment where the cathode 220 is an ESC, a surface of the ESC, such as a puck surface upon which the workpiece 210 is disposed during processing or a peripheral surface of the ESC is covered with a plasma resistant coating as schematically depicted in FIG. 3A or 4A.

FIG. 3A depicts a cross sectional view of a portion of a plasma chamber component 300 including a plasma resistant coating 315. The plasma chamber component 300 includes a substrate 310 having an outer substrate surface 311 over which the plasma resistant coating 315 is deposited to provide an outer coating surface 316 which is to be exposed to a plasma during plasma processing of a workpiece. The substrate 310 may be any conventional material, such as aluminum or aluminum alloy, quartz, ceramic, composite material, or the like. The substrate 310 may further include an integral surface coating (not depicted). An integral surface coating forms a unitary and continuous structure with the substrate 310. An integral surface coating is typically formed in-situ from the substrate 310 using at least a portion of the underlying component material. For example, for an aluminum substrate 310, an integral surface coating of aluminum oxide (Al—O) or aluminum nitride (Al—N) may be "grown." An integral surface coating is formed from the substrate 310 by, for example, anodizing the substrate 310. Plasma resistant coatings in accordance with embodiments of the present invention are distinguished from integral surface coatings in that the plasma resistant coatings are non-native. For example, in an embodiment where the substrate 310 is an aluminum alloy, the plasma resistant coating is substantially free of aluminum.

In embodiments of the present invention, the plasma resistant coating 315 formed over the substrate 310 is a non-thermal sprayed coating. It has been found that plasma sprayed coatings contaminate substrates processed in a plasma chamber. For example, yttrium (Y) contamination has been found on substrates subsequent to plasma processing in a chamber having components with a plasma sprayed yttria ($Y_2O_3$) coating. During investigation of this phenomena, it was found that plasma sprayed coatings have a high density of cracks and voids throughout the thickness of the coating, which is a function of the lamellae as depicted in FIG. 1. Typical plasma sprayed coatings have a porosity of 3% or more. Plasma sprayed coatings surfaces are also characteristically rough with a typical arithmetic roughness average ($R_a$) being on the order of 5 micrometers (μm). Because cracks, voids and particulates are unevenly eroded during plasma exposure, a plasma-spray coated component develops a rough plasma etched surface having particles up to 25 μm in diameter. Formation of such large surface particles may result from preferential erosion along grain or particle boundaries where the film stress is relatively high and the bonding strength relatively low. Rough peaks found on plasma etched coatings indicate such particles eventually break off and potentially contaminate substrates processed in the chamber. Substrate contamination, plasma process drift and component surface deterioration have therefore been correlated to the cracks, voids, rough surfaces and large particulates present in a plasma sprayed coating. Notably, a similar evaluation of process chamber components formed from bulk ceramic (e.g., bulk yttria) also identified numerous voids having a diameter of 25 μm or more. As such, bulk ceramics provide little improvement in plasma resistance over plasma sprayed varieties.

To reduce contamination and particle formation, embodiments of the plasma resistant coating 315 are formed to have a low porosity and low surface roughness. In an embodiment, the plasma resistant coating 315 has a porosity of less than approximately 1%. Porosity is expressed as the percentage of open space in the total volume of the coating with a lower porosity being an indication that a coating is denser. In further embodiments, the porosity is essentially 0%, providing maximum density for a particular film composition. Such a low coating porosity was previously unachievable with conventional coating deposition methods, such as plasma spraying, with even compressively stressed coatings having a porosity well above 1%.

In another embodiment, the outer coating surface 316 has a $R_a$ value below approximately 1 μm for a coating having a thickness of 30 μm or more. In certain embodiments the outer coating surface 316 has a $R_a$ value below 0.25 μm and may be as low as 0.025 μm. In comparison, plasma sprayed coating surfaces typically have an $R_a$ value of at least 5 μm and are often deliberately roughened to an $R_a$ value 10 μm to 25 μm. Contrary to a popular belief that plasma process byproducts may better adhere to a rough chamber surface (reducing contamination), extensive manufacturing studies have revealed that a smoother outer coating surface 316 improves process cleanliness. While not being bound by theory, a smoother surface is thought to improve effectiveness of in-situ chamber clean (ICC) processes, reducing the need for wet cleans. In some embodiments, the substrate 310 may also be prepared for the non-plasma sprayed coating in a manner that renders outer substrate surface 311 relatively smooth. For example, the outer substrate surface 311 may be prepared to have a $R_a$ of less than approximately 4 μm, which is achievable with machined component surfaces. The low roughness of outer substrate surface 311 is also in contrast to a plasma spraying method where a substrate surface would typically be roughened to a surface $R_a$ of at least 4 μm in an effort to improve adhesion of the spray coating. In some embodiments, the substrate 310 may also be prepared with the outer substrate surface 311 having a desired $R_a$ (e.g. ≅0.4 μm). As the plasma resistance coating may be uniformly distributed over the outer substrate surface 311, the coating surface 316 maintains the original surface $R_a$ of the outer substrate surface 3δ 1 after the deposition of plasma resistant coating 315. The desired $R_a$ may be determined based on the desired performance of the plasma chamber component 300, such as chucking and de-chucking function for an ESC.

In an embodiment of the present invention, the plasma resistant coating 315 is a ceramic including a primary constituent of: an oxide, nitride, boride, carbide, or fluoride of any of scandium (Sc), ytterium (Y), iridium (Ir), rhodium (Rh), a lanthanoid (e.g., lanthanum (La), cerium (Ce), europium (Eu), dysprosium (Dy), or erbium (Er)), or hafnium (Hf). One exemplary coating composition includes $Y_2O_3$ as the primary constituent (i.e. "$Y_2O_3$-based"). Another exemplary coating composition includes $YF_3$ as the primary constituent (i.e. "$YF_3$-based"). Another exemplary coating composition includes $Er_2O_3$ as the primary constituent (i.e. "$Er_2O_3$-based"). In addition to the primary constituent, the plasma resistant coating 315 may further include lesser amounts of other ceramics, such as silicon carbide (SiC) and zirconium oxide ($ZrO_2$), to form, for example, a matrix/solute or a superlattice. One exemplary $Y_2O_3$-based composition includes 0.5-1.1 atomic % C, 58-60 atomic % O, 0-0.5 atomic % F, and 39-40 atomic % Y.

Figure 3B:
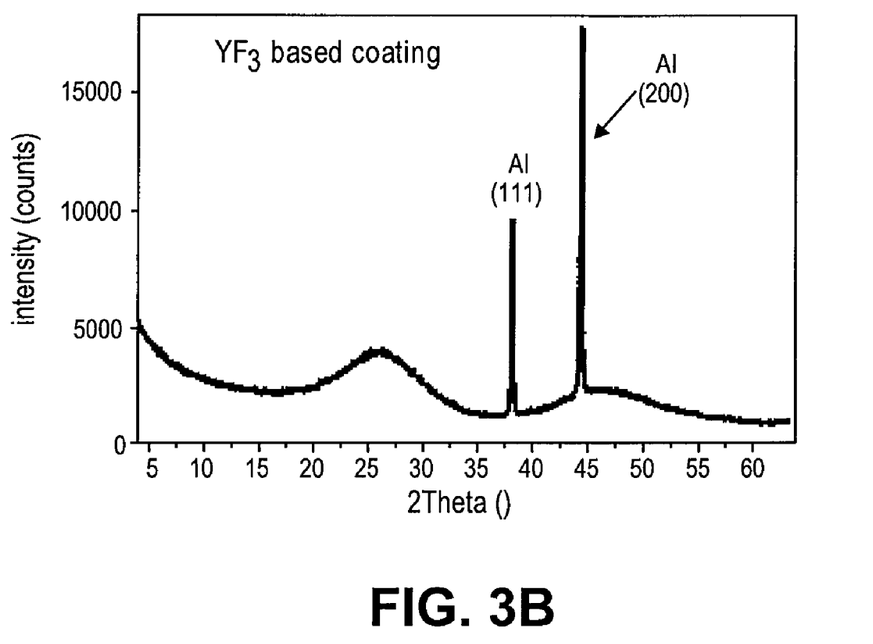
FIGS. 3B and 3C illustrate morphology and erosion resistance, respectively, of a plasma resistant coating in accordance with an embodiment of the present invention.
Figure 3C:
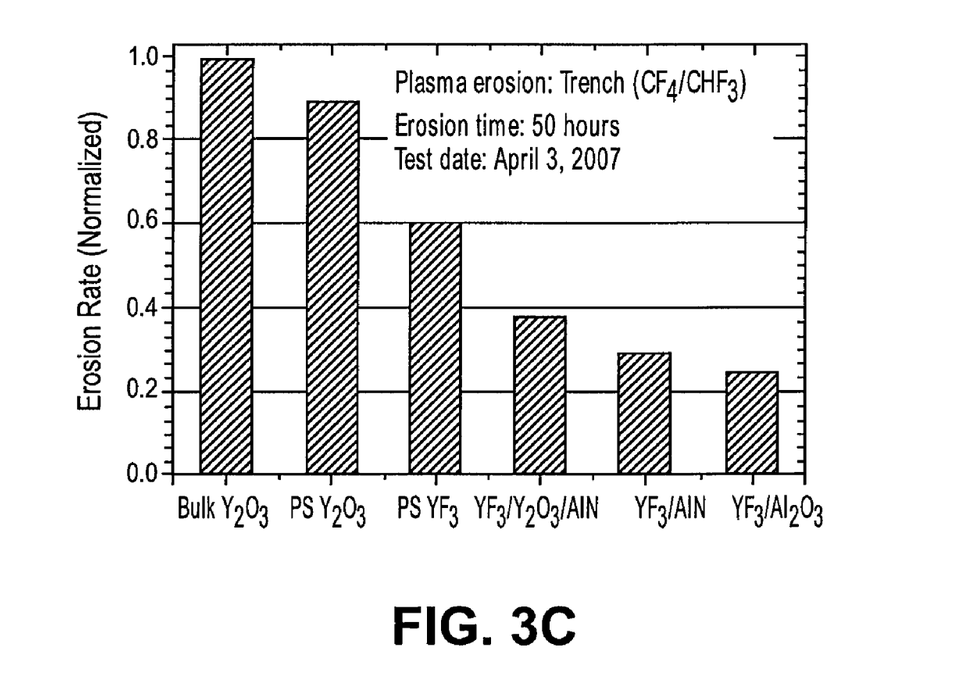

In an embodiment of the present invention, the plasma resistant coating 315 has an amorphous microstructure. FIG. 3B depicts x-ray diffraction (XRD) data for a $YF_3$-based plasma resistant coating 315 on an aluminum-based substrate 310. As shown, only aluminum peaks from the substrate 310 are distinguishable. An amorphous microstructure may be advantageous in that component surface roughness and contamination attributable to preferential etching at grain boundaries are reduced. The effect of the amorphous microstructure is further evident in FIG. 3C where an erosion rate of plasma sprayed $YF_3$-based coating ("PS $YF_3$") is approximately twice that of an amorphous YF$_3$-based coating ("YF$_3$/Al—N") in accordance with an embodiment of the present invention.

Figure 3D:
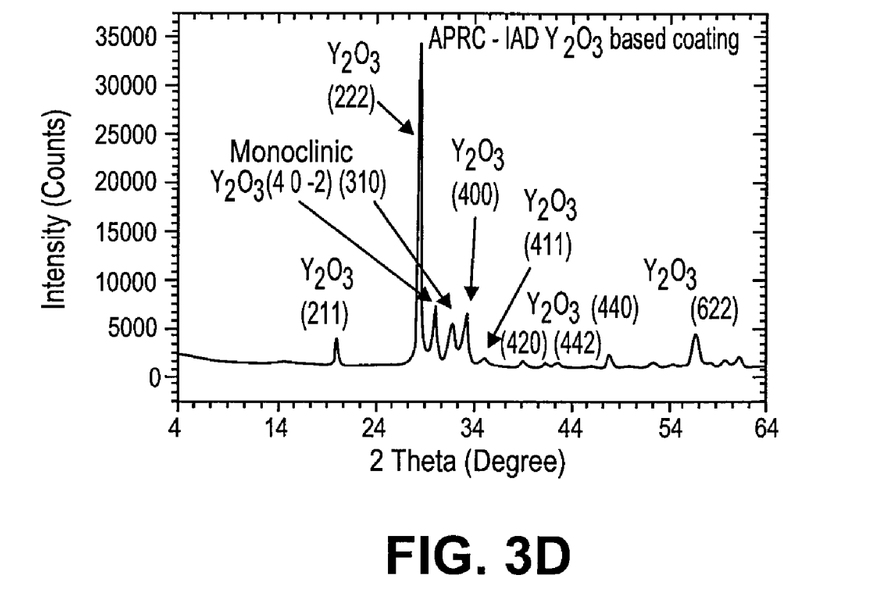
FIGS. 3D and 3E illustrate morphology and erosion resistance, respectively, of a plasma resistant coating in accordance with another embodiment of the present invention.
Figure 3E:
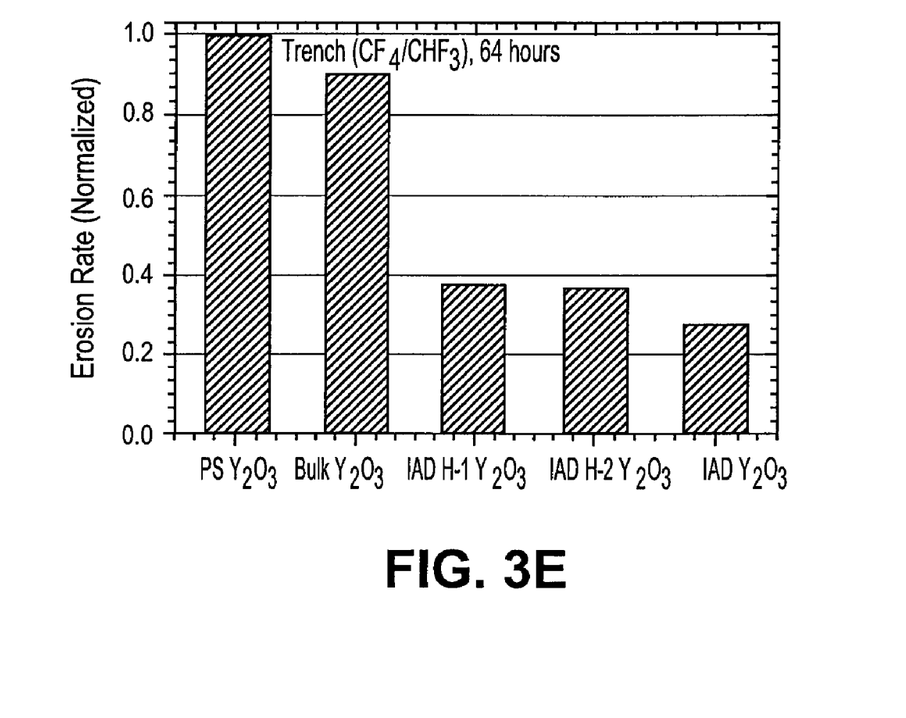

In an alternate embodiment, the plasma resistant coating 315 has a fine grain crystalline microstructure. In an exemplary embodiment, the grain size is no larger than 0.5 µm. In a further embodiment, the plasma resistant coating 315 has a textured crystalline microstructure having a non-random crystal orientation. The non-random crystal orientation may have a preferred out-of-plane growth orientation. In the embodiment depicted in the FIG. 3A, the out-of-plane growth orientation is along the y-axis. In one such embodiment, the preferred out-of-plane growth orients a crystal plane of highest density on the outer coating surface 316 to face a plasma. In such embodiments, the plasma resistant coating 315 has a compacted structure with atoms stocked along the orientation of the dense crystal plane during formation of the coating. For example, for a typical face-centered cubic (FCC) crystal structure, the (111) plane is oriented out-of-plane (y-axis) such that the (111) plane forms the outer coating surface 316. In this manner, the densest plane of the coating material is exposed to the plasma during plasma chamber use. XRD data for an exemplary textured Y$_2$O$_3$-based plasma resistant coating is depicted in FIG. 3D. As shown, the (222) peak is prominent, indicating the compact atom-stocked plane (111) will face the plasma during use. The effect of texture on plasma erosion rates is shown in FIG. 3E. As depicted, a plasma sprayed Y$_2$O$_3$ treatment ("PS Y$_2$O$_3$") has an erosion rate more than three times greater than the textured treatment ("IAD Y$_2$O$_3$"), where "IAD" indicates the film was formed by ion assisted deposition, as discussed in further detail elsewhere herein.

In an embodiment, the plasma resistant coating 315 has relatively high electrical resistance, low and stable leakage currents and a relatively high breakdown voltage ($V_{BD}$). Such characteristics are advantageous for ESC applications. It has been found that conventional Al—N or Al—O coated ESC surfaces can suffer dramatic fluctuations in leakage current magnitudes over a time scale on the order of minutes while a plasma processing chamber is in use. An investigation of this phenomena attributed increased ESC leakage currents to UV exposure. UV emission is generally present in all plasma processing. In particular, UV exposure of the ESC during in-situ chamber clean (ICC) sequences (when the ESC is typically not holding a workpiece for plasma processing) has been found to greatly increase ESC leakage currents. Because an ICC is usually performed between the plasma processing of successive workpieces, ESC leakage current trends high during initial processing of a workpiece (immediately following an ICC) and declines with workpiece processing time until the workpiece is removed and the ICC is repeated. This variation in ESC leakage current can cause both chucking and de-chucking problems ultimately requiring replacement of expensive components.

Figure 3F:
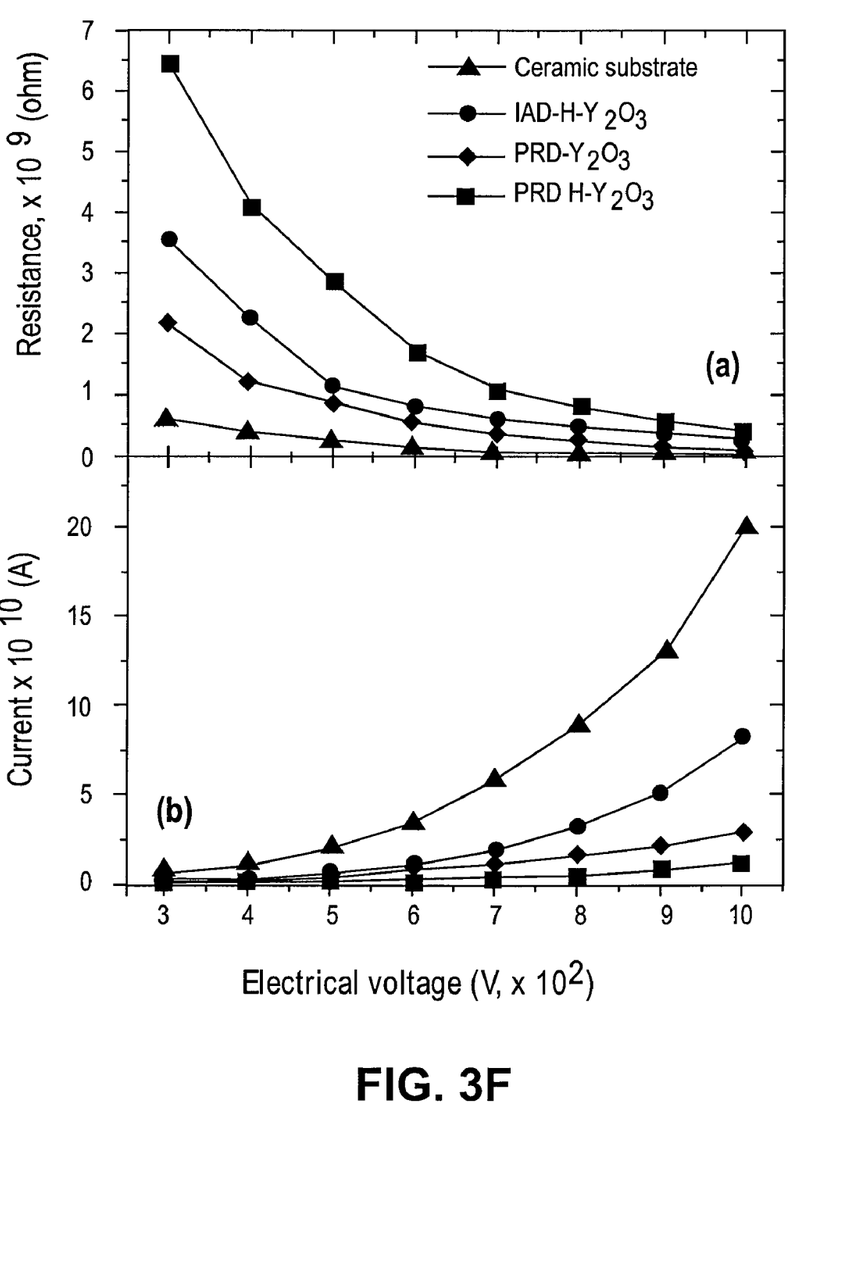
FIG. 3F illustrates electrical resistance characteristics of a plasma resistant coating in accordance with the embodiments depicted in FIG. 3A through 3E.

In a particular embodiment where the plasma chamber component 300 is an ESC, the plasma resistant coating 315 mitigates ESC leakage current fluctuation. In particular, it has been found that yttrium-based coatings prevent the leakage current drift attributable to UV exposure. In addition to reducing leakage current variation, the plasma resistant coating 315 may provide other characteristics which are particularly advantageous for ESC applications, such as the ability to have substantially lower R$_a$ than possible with a plasma sprayed coating. FIG. 3F depicts electrical characteristics for one exemplary yttrium-based ESC coating ("PRD-Y$_2$O$_3$") embodiment compared to an Al—N ceramic control ("Ceramic substrate"). As shown, the leakage current for the control is approximately an order of magnitude higher than for the "PRD-Y$_2$O$_3$" coating. "PRD" indicates the film was formed by plasma reactive deposition, as discussed in further detail elsewhere herein.

In further embodiments, the plasma resistant coating 315 has a break down voltage of at least 1000 V/mil (thou). In particular embodiments, the break down voltage is greater than 3500 V/mil (thou). In comparison, conventional plasma sprayed Y$_2$O$_3$ coating typically has a $V_{BD}$ of approximately 750 V/mil (thou). The higher breakdown of the embodiments disclosed herein may also be advantageous for ESC components. Furthermore, the smoothness of the plasma resistant coating 315, as previously described, provides advantageously low ESC helium leak rates. Additionally, the plasma resistant coating 315 reduces AlFx formation on an ESC surface upon plasma exposure. The reduction in AlFx formation improves the lifetime of an ESC and reduces particulate contamination of workpieces disposed on an ESC during plasma processing. In further embodiments, the plasma resistant coating 315 may be applied, as described herein, to refurbish an ESC after a period of plasma exposure.

FIG. 4A depicts a cross sectional view of a portion of a plasma chamber component 400 including a hybrid coating 413. A hybrid coating includes at least two distinct material layers. The distinct coating layers may either be substantially free of the base materials in the substrate over which the coating layers are formed, or one or both of them are the same chemical composition as the substrate, but the coating layers have a crystalline structure different than that of the substrate. In either respect, the hybrid coating layers provide different performance characteristics than the substrate. As shown in FIG. 4A, the plasma resistant coating 315 is deposited on an intermediate layer (or layers) 412 to form the hybrid coating 413. The multiple layers in the hybrid coating 413 allow the intermediate layer(s) 412 to provide one or more advantageous characteristics (e.g., high conductivity, high resistance, UV protection, etc.) while the plasma resistant coating 315 provides plasma resistance. Alternatively, the multiple layers of the hybrid coating 413 allow the intermediate layer(s) 412 to provide a plasma resistant coating of a first composition while the plasma resistant coating 315 provides a plasma resistant coating of a second composition (e.g., a Y$_2$O$_3$-based coating on a YF$_3$-based intermediate layer).

Any of the various metals and their oxides, nitrides, borides, fluorides and carbides described from the plasma resistant coating 315 may be utilized for the intermediate layer(s) 412, depending on the desired function. Other non-plasma resistant materials may also be used. For example, in one embodiment, the hybrid coating 413 includes intermediate layer(s) 412 which is an oxide of an element absent in the plasma resistant coating. In one embodiment, where the chamber component is an ESC, the intermediate layer 412 is SiO$_2$ for reduce leakage current during workpiece clamping. As shown in FIG. 3F, a ceramic substrate with an exemplary hybrid coating of a Y$_2$O$_3$-based layer over a SiO$_2$ layer ("PRD H-Y$_2$O$_3$") displays the highest resistance and lowest current leakage of any of the treatments graphed. The addition of the intermediate layer of SiO$_2$ relative to a non-hybrid coating ("PRD-Y$_2$O$_3$") illustrates the reduction in current leakage that is possible with a hybrid coating. In a particular embodiment, the Y$_2$O$_3$—SiO$_2$ hybrid coating provided a leakage current of 0.1 µA with a substrate chucked at 20 Torr of backside helium pressure and 500 V applied.

Layers of the hybrid coating 413 may be of various thicknesses based on the functional role of the intermediate layer 412. For example, where the component is an ESC and the intermediate layer 412 is to reduce current leakage, an intermediate $SiO_2$ layer may, for example, be deposited to a thickness between one fourth and two times that of the plasma resistant coating 315. In two exemplary embodiments utilizing a 20 μm $Y_2O_3$-based plasma resistant coating, one hybrid coating included a 5 μm intermediate $SiO_2$ layer while a second hybrid coating included a 10 μm intermediate $SiO_2$ layer. Leakage current was found to be significantly lower for the embodiment with the thicker $SiO_2$ layer.

The effect of a hybrid coating structure on erosion rate is visible in FIG. 3E. As shown, both hybrid coating treatments ("IAD H-1 $Y_2O_3$" and "IAD H-2 $Y_2O_3$") have erosion rates significantly lower than control treatments ("PS $Y_2O_3$" and "Bulk $Y_2O_3$") and comparable to the non-hybrid coating treatment ("IAD $Y_2O_3$"). As such, both plasma resistance and improved functionality (e.g., reduced leakage current) may be achieved for an ESC having the hybrid coating 413, as depicted in FIG. 4A. A hybrid coating structure may also improve adhesion of the plasma resistant coating 315. It was found that a $SiO_2/Y_2O_3$ hybrid coating had reduced peeling relative to a single $Y_2O_3$-based coating layer.

With the composition, morphology, microstructure and electrical properties of plasma resistant coating embodiments described, methods to form such coatings are now discussed. In one embodiment, the method utilized for the deposition of the plasma resistant coating 315 utilizes energetic particle interaction to provide one or more of the morphology, microstructure and electrical properties previously described herein. The energetic particles may include ions, neutron atoms, radicals, and nano-sized particles which come from particle generation sources, such as the plasma, reactive gases or from the material source that provide the deposition materials. The energetic particles are smaller than any particles generated by state of the art thermal sprays and in particular embodiments, the energetic particles are predominantly ions. For embodiments employing the hybrid coating 413, both the intermediate layer(s) 412 and the plasma resistant coating 315 may be deposited in the presence of energetic particles. Use of such deposition methods may be advantageous because they better approximate the conditions for which the plasma resistant coating is to withstand during component use in a plasma chamber. A plasma resistant coating accumulated in the presence of an energetic particle interaction may be formed in a manner more resistant to similar conditions present in a plasma processing chamber.

Figure 5A:
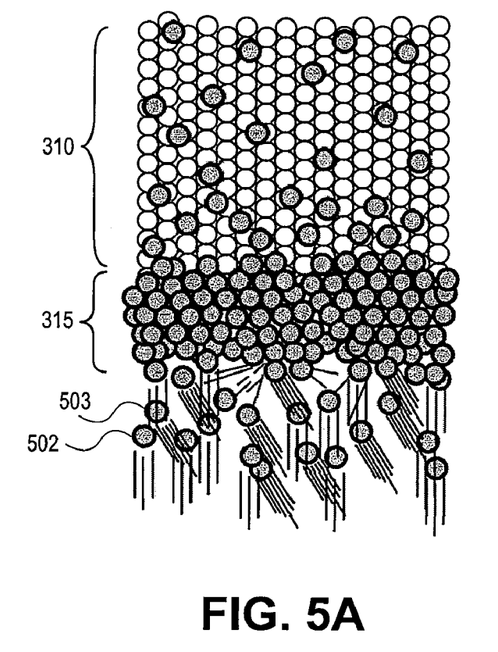
FIG. 5A illustrates a deposition mechanism for a plasma resistant coating, in accordance with an embodiment of the present invention.

FIG. 5A depicts a deposition mechanism applicable to a variety of deposition methods utilizing energetic particles. As shown, the plasma resistant coating 315 is formed by an accumulation of deposition materials 502 in the presence of energetic particles 503. The deposition materials include atoms, ions, radicals, or their mixture. The energetic particles 503 may impinge and compact the plasma resistant coating 315 as it is formed. The energetic particles 503 may also sputter the plasma resistant coating 315 as it is formed at rates dependent on crystal orientation and/or localized non-uniformities in microstructure or morphology to provide the properties described elsewhere herein. It should be appreciated that plasma spray or any other thermal spray is unable to provide such process conditions.

Figure 5B:
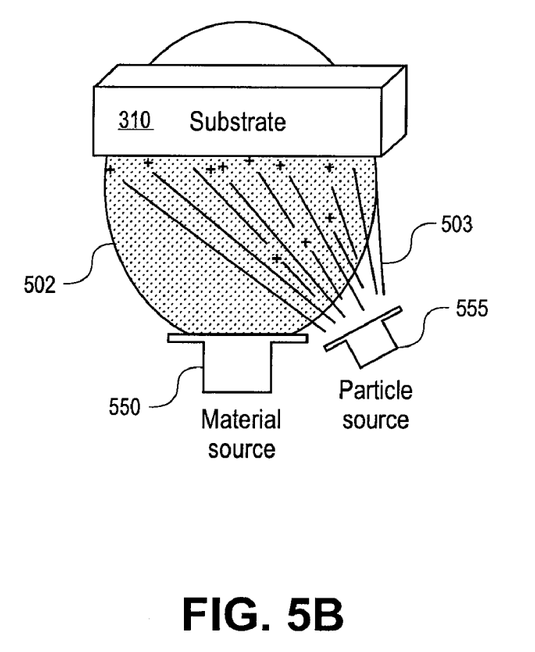
FIG. 5B illustrates an apparatus for depositing a plasma resistant coating over a component, in accordance with an embodiment of the present invention.

In one embodiment, ion assisted deposition (IAD) is utilized to form the plasma resistant coating 315, as previously described elsewhere herein. FIG. 5B depicts a schematic of an IAD deposition apparatus. As shown, a material source 550 provides a flux of deposition materials 502 while an energetic ion source 555 provides a flux of the energetic ions 503, both of which impinge upon the substrate 310 throughout the IAD process. IAD may utilize one or more plasmas or beams to provide the material and energetic ion sources. Reactive species may also be provided during deposition of the plasma resistant coating. In one embodiment, the energetic ions 503 include at least one of non-reactive species (e.g., Ar) or reactive species (e.g., O). In further embodiments, reactive species such as CO and halogens (Cl, F, Br, etc.) may also be introduced during the formation of a plasma resistant coating to further increase the tendency to selectively remove deposited material most weakly bonded to the plasma resistant coating.

With IAD processes, the energetic ions 503 may be controlled by the energetic ion source 555 independently of other deposition parameters. According to the energy, density and incident angle of the energetic ion flux, composition, structure, crystalline orientation and grain size of the coating may be manipulated. Ion bombardment can provide unique process advantages, such as, but not limited to cleaning the surface of substrate 310, implanting the energetic particles into the substrate 310 (as depicted in FIG. 5A) and tailor the atomic bonding. While the coating is accumulated, levels of ion bombardment may be tailored to provide a plasma resistant coating having the advantageous properties described elsewhere herein.

Figure 4B:
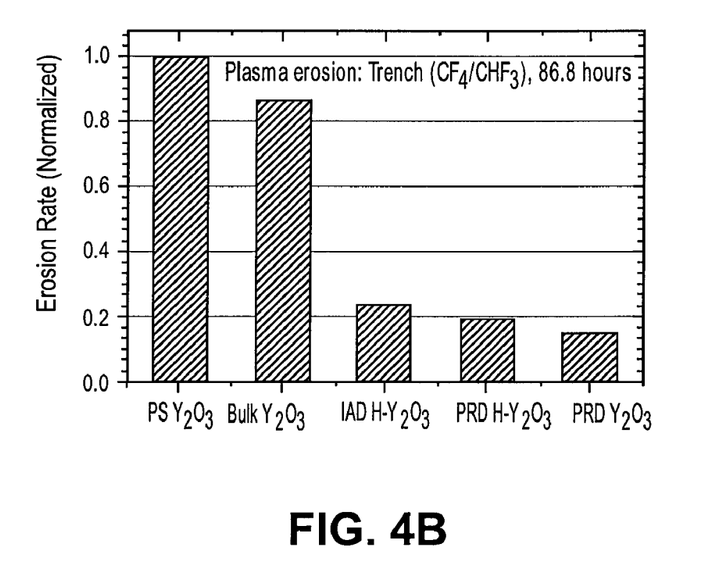
FIG. 4B illustrates erosion resistance of plasma resistant coatings formed by particular methods, in accordance with an embodiment of the present invention.

In another embodiment, plasma reactive deposition (PRD) is utilized to form the plasma resistant coating 315, as previously described elsewhere herein. Such methods are similar to IAD methods in that energetic ions or particles are also utilized, however the energetic ion source is not distinct from the deposition material source or plasma source as it is for IAD methods. Process parameters are instead adjusted to balance energetic particle (ion) production with material particles (neutral). For example, ions created from the plasma sources may be energized sufficiently to provide bombardment capable of yielding the advantageous plasma resistant coating properties previously described elsewhere herein. In one such embodiment, a substrate is coated using process parameters that result in a relatively high substrate bias (e.g., 100 or more volts) to provide adequate energetic particle bombardment of the coating during formation. In some PRD embodiments, the substrate material is selected to render a plasma resistant coating having an advantageously small grain size. For example, one embodiment utilizes an Al—N substrate surface so that nucleation rates are high to reduce the grain size of the plasma resistant coating. In some PRD embodiments, the substrate materials are immersed into the plasma for non-line-of-sight growth of a plasma resistant coating. The resulting plasma resistant coating will then cover all substrate surfaces. Such a coating may be formed by a substantially isotropic deposition process which provides a uniform coating thickness over complex geometries. FIG. 4B further depicts a comparison between erosion rates of a $SiO_2/Y_2O_3$ hybrid coating deposited by both an IAD method ("IAD H-$Y_2O_3$") and a PRD method ("PRD H-$Y_2O_3$").

Exemplary IAD methods include deposition processes which incorporate ion bombardment, such as the evaporation (e.g., activated reactive evaporation (ARE)) and sputtering in the presence of ion bombardment to form plasma resistant coatings as described herein. Any of the IAD methods may be performed in the presence of a reactive gas species, such as $O_2$, $N_2$, halogens, etc. The reactive gas species may enable formation of a ceramic (e.g., oxide) from a metal material source (target) or metalorganic gas species.

Exemplary PRD methods include deposition processes, such as plasma-based sputtering and plasma-enhanced chemical vapor deposition (PECVD) tuned to provide a level particle bombardment sufficient to provide coatings having the properties described elsewhere herein, plasma enhanced evaporation, ion plating, ionized metal plasma (IMP) or plasma immersion ion process (PIIP). The PIIP technique, for example, uses radio-frequency (RF) inductive plasma sources to provide a non-line-of-sight deposition process that produces hard and adherent coatings on substrates. In PIIP deposition, a dc-pulsed negative bias may be applied to the stage holding the substrate so that positive ions are attracted from the plasma to bombard a plasma resistant coating as it accumulates or grows on the substrate. Any of these methods may be performed in the presence of a reactive gas species, such as $O_2$, $N_2$, halogens, etc. The reactive gas species may enable formation of a ceramic (e.g., oxide) from a metal material source (target) or metalorganic gas species.

Figure 6A:
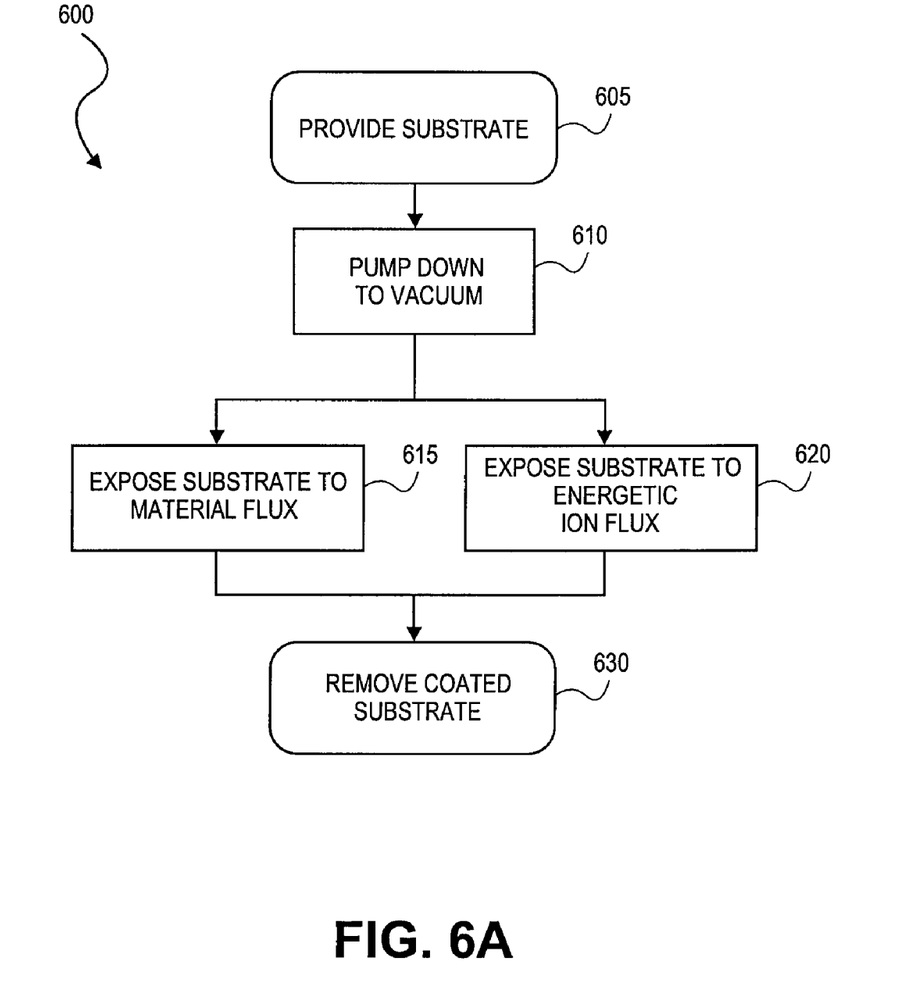
FIGS. 6A-6B illustrate flow diagrams of methods for depositing a plasma resistant coating over a component, in accordance with embodiments of the present invention.

An exemplary IAD or PRD method is depicted in method 600 of FIG. 6A. As shown, method 600 begins at operation 605 with provision of a substrate to be coated. The substrate may be any of those previously described for substrate 310 and the like. At operation 610 the substrate is pumped down in a vacuum chamber. At operations 615 and 620, the substrate is exposed to a deposition material flux and exposed to an energetic particle flux, respectively. In particular IAD and PRD embodiments, the substrate is exposed to the deposition material flux while the substrate is exposed to the energetic ion flux (i.e. concurrently or simultaneously). In other IAD embodiments, the substrate is alternately exposed to the deposition material flux and to the energetic ion flux (i.e. successive deposition/bombardment cycles). In another embodiment, process conditions of a PRD process may be cycled between states to alternately favor deposition and bombardment. After coating the substrate, method 600 completes at operation 630 with removal of the coated substrate from the deposition chamber. In a further embodiment (not depicted), the coated substrate may then be exposed to further processing such as a thermal anneal or an ion implant subsequent to deposition of the plasma resistant coating.

Figure 5C:
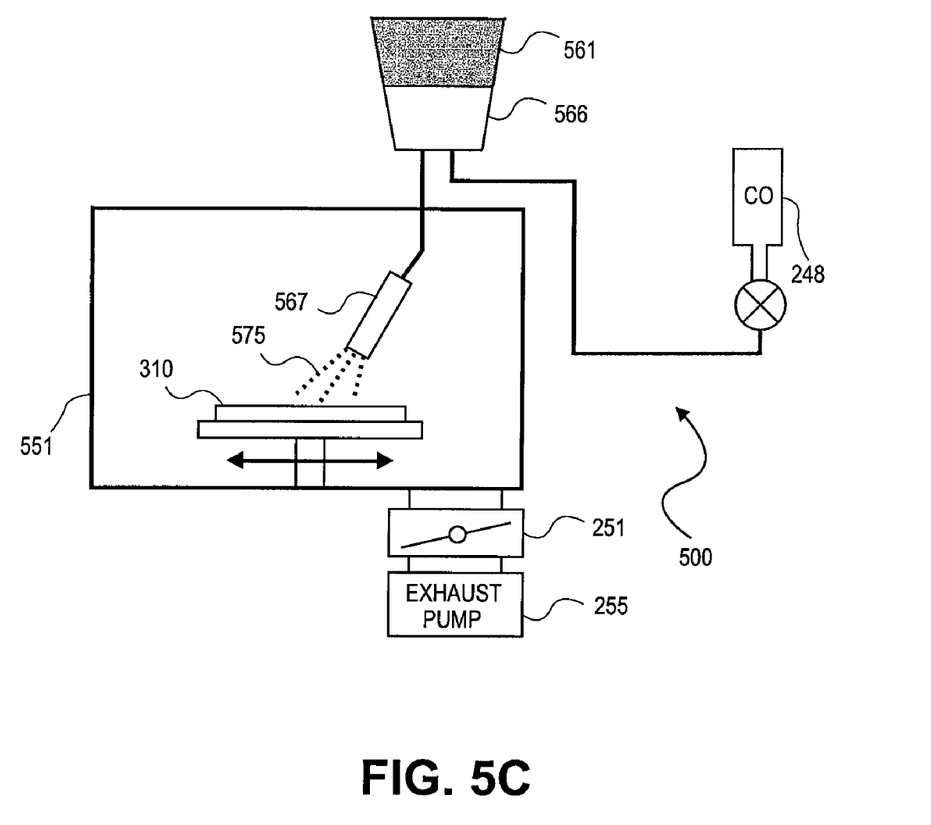
FIG. 5C illustrates an apparatus for depositing a plasma resistant coating over a component, in accordance with an embodiment of the present invention.
Figure 6B:
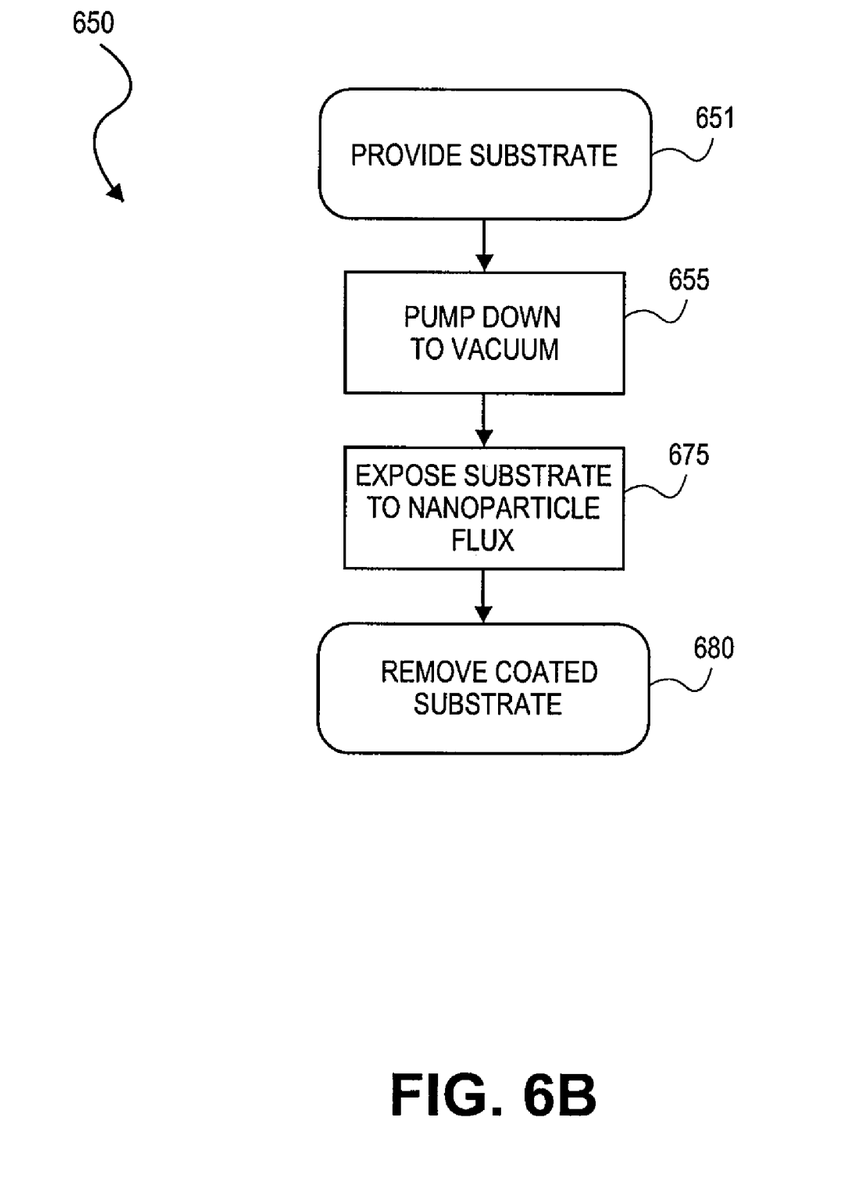

In another embodiment, a nanoparticle mass flow deposition method is utilized to form any of the plasma resistant coatings previously described elsewhere herein. An example of such a method is aerosol deposition (AD). Nanoparticle mass flow deposition is distinguished from thermal spray processes at least by the size of the particles deposited onto a substrate. For example, a particular aerosol deposition processes utilizes particles in the range of 1 nm-1 μm in diameter. Nanoparticle mass flow deposition is further distinguished from thermal sprays in that the particles deposited are at a low temperature (not melted or softened). FIG. 5C depicts an exemplary AD apparatus 500 including a deposition chamber 550 connected to a vacuum pump 560. A gas source 565 is provided to ceramic power 566 in a aerosol chamber 561 to provide nanoparticles 575 to the substrate 310 as an aerosol though a nozzle 567. The AD apparatus 500 may be operated to perform the nanoparticle mass flow deposition method 600, as depicted in FIG. 6B. The nanoparticle mass flow deposition method 650 begins at operation 651 with the provision of a substrate, such as substrate 310 or the like. At operation 655, the deposition chamber is pumped down to a suitable vacuum level and the substrate is exposed to a nanoparticle flux at operation 675. At operation 680, the coated substrate is removed.

It is to be understood that the above description is intended to be illustrative, and not restrictive. Many other embodiments will be apparent to those of skill in the art upon reading and understanding the above description. For example, alternative deposition methods, such as sol-gel techniques, may be utilized to provide a plasma resistant coating having properties as previously described elsewhere herein. Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A component of a plasma processing chamber, comprising:
   a substrate; and
   a plasma resistant coating disposed over at least a portion of the substrate, wherein the plasma resistant coating comprises a ceramic non-native to the substrate and having a porosity below 1%, wherein the primary constituent of the ceramic is $Y_2O_3$ and wherein the ceramic is polycrystalline with a crystal texture having a preferred out-of-plane growth orientation presenting the (111) plane of the $Y_2O_3$ on an outer surface of the plasma resistant coating.

2. A plasma processing chamber component as in claim 1, wherein the plasma resistant coating porosity is 0%.

3. A plasma processing chamber component as in claim 1, wherein the outer surface of the plasma resistant coating has an arithmetic roughness average ($R_a$) of less than 1 μm.

4. A plasma processing chamber component as in claim 3, wherein the component is an electrostatic chuck component and wherein the plasma resistant coating has a breakdown voltage of at least 1000 V/mil.

5. A plasma processing chamber component as in claim 4, wherein the ceramic further comprises at least one of: an oxide, nitride, boride, carbide, or halide of an element selected from the group consisting of: Y, Ir, Rh, and lanthanoids.

6. A plasma processing chamber component as in claim 5, wherein the plasma processing chamber component further comprises an intermediate layer disposed between the substrate and the plasma resistant coating, wherein the intermediate layer comprises an oxide, nitride or carbide of an element other than the element selected from the group consisting of Y, Ir, Rh, and lanthanoids for the primary constituent.

7. A plasma processing chamber component as in claim 6, wherein the intermediate layer comprises $SiO_2$.

8. A plasma processing chamber component as in claim 1, wherein the substrate is a ceramic or aluminum alloy and the plasma resistant coating is substantially free of aluminum or wherein the substrate is quartz and the plasma resistant coating is substantially free of silicon.

9. A method of forming the plasma chamber component of claim 1, the method comprising:
   receiving the substrate; and
   forming the plasma resistant coating over the substrate under conditions which expose the plasma resistant coating to energetic particles having a diameter less than approximately 1 μm as the coating is formed.

10. A method as in claim 9, wherein forming the plasma resistant coating further comprises depositing at least one of: an oxide, nitride, boride, carbide, or fluoride of an element selected from the group consisting of: Y, Ir, Rh, and lanthanoids.

11. A method as in claim 9, wherein the energetic particles are charged and the deposition method comprises at least one of a halogen or oxygen as a reactive gas species.

12. A method as in claim 9, wherein the plasma resistant coating is deposited by ion assisted deposition (IAD) or plasma reactive deposition (PRD).

13. A method as in claim 9, wherein the substrate is electrically biased while the plasma resistant coating is deposited over the component substrate.

14. A method as in claim 13, wherein the plasma resistant coating is deposited by plasma enhanced CVD, plasma enhanced evaporative or physical vapor deposition process, or plasma immersion ion process (PIIP).

15. A method as in claim 9, wherein the component is an electrostatic chuck and the method further comprises:
depositing an intermediate layer on the electrostatic chuck substrate prior to depositing the plasma resistant coating, wherein the intermediate layer comprises an oxide of an element absent in the plasma resistant coating.

16. A method as in claim 15, wherein the intermediate layer comprises $SiO_2$.

17. The method as in claim 9, wherein the plasma resistant coating is ion implanted subsequent to deposition of the plasma resistant coating.

18. A method of forming the plasma chamber component of claim 1, the method comprising:
receiving the substrate; and
forming the plasma resistant coating over the substrate with a nanoparticle mass flow deposition process.

19. A method as in claim 18, wherein the nanoparticle is a ceramic particle having a dimension less than 1 μm and comprising at least one of: an oxide, nitride, boride, carbide, or halide of an element selected from the group consisting of: Y, Ir, Rh, and lanthanoids.

20. A method as in claim 18, wherein the component is an electrostatic chuck and the method further comprises:
depositing an intermediate layer on the electrostatic chuck substrate prior to depositing the plasma resistant coating, wherein the intermediate layer comprises an oxide of an element absent in the plasma resistant coating.

21. A method as in claim 20, wherein the intermediate layer comprises $SiO_2$.

22. A plasma processing chamber component as in claim 1, wherein a surface of the substrate over which the plasma resistant coating is formed has an arithmetic roughness average ($R_a$) between 0.4 μm and 4 μm and wherein the surface of the plasma resistant coating maintains the surface $R_a$ of the substrate surface.

23. A plasma processing chamber component as in claim 1, wherein the component is an electrostatic chuck.

24. A plasma processing chamber component as in claim 1, wherein the component is selected from the group consisting of: process kits, focus rings, shower heads and lids.

* * * * *